US012706575B2

(12) United States Patent
Canning et al.

(10) Patent No.: US 12,706,575 B2
(45) Date of Patent: Aug. 11, 2026

(54) RF AMPLIFIER

(71) Applicant: Infineon Technologies AG, Neubiberg (DE)

(72) Inventors: Timothy Canning, Regensburg (DE); Helmut Brech, Lappersdorf (DE)

(73) Assignee: Infineon Technologies AG, Neubiberg (DE)

( * ) Notice: Subject to any disclaimer, the term of this patent is extended or adjusted under 35 U.S.C. 154(b) by 842 days.

(21) Appl. No.: 18/051,999

(22) Filed: Nov. 2, 2022

(65) Prior Publication Data

US 2024/0154584 A1 May 9, 2024

(51) Int. Cl.
*H03F 3/193* (2006.01)
*H03F 1/02* (2006.01)
*H03F 1/30* (2006.01)

(52) U.S. Cl.
CPC ........... *H03F 3/193* (2013.01); *H03F 1/0222* (2013.01); *H03F 1/301* (2013.01); *H03F 2200/451* (2013.01)

(58) Field of Classification Search
CPC ........ H03F 3/193; H03F 1/0222; H03F 1/301; H03F 2200/451; H03F 2200/198; H03F 2200/405; H03F 3/602; H03F 2200/447; H03F 1/0288; H03F 3/195; H03F 3/245; H03F 3/211; H03F 3/19
USPC .......................................................... 330/296
See application file for complete search history.

(56) References Cited

U.S. PATENT DOCUMENTS

2013/0063213 A1* 3/2013 Kobayashi .............. H03F 3/189 330/291
2023/0128387 A1* 4/2023 Ladhani .................. H03F 3/195 330/124 R

OTHER PUBLICATIONS

Sharma, Tushar et al., "Digitally Assisted Load Modulated Balanced Amplifier for 200W Cellular Infrastructure Applications", Research Gate, http://www.researchgate.net/publication/345313947, Nov. 2020, 5 pages.
Zhou, Saad P., et al., "Doherty Load Modulation Based on Non-Reciprocity", Chalmers University of Technology, https://research.chalmers.se, IEEE European Microwave Conference, Apr. 4-6, 2022, 5 pages.

* cited by examiner

*Primary Examiner* — Andrea Lindgren Baltzell
*Assistant Examiner* — Jose E Pinero
(74) *Attorney, Agent, or Firm* — Slater Matsil, LLP

(57) ABSTRACT

In accordance with an embodiment, an RF amplifier includes: a first amplifier including a first transistor coupled to a first supply node configured to provide a first supply voltage, the first transistor having a first device periphery; a second amplifier including a second transistor coupled to a second supply node configured to provide a second supply voltage higher than the first supply voltage, the second transistor having a second device periphery; and a combining network coupled to an output of the first amplifier, an output of the second amplifier, and an RF output port. The first device periphery, the first supply voltage, the second device periphery, and the second supply voltage are configured to maintain a junction temperature ratio of between 0.3 and 1.0, and the junction temperature ratio is a ratio of a temperature of the first amplifier to a temperature of the second amplifier.

22 Claims, 5 Drawing Sheets

RF AMPLIFIER

TECHNICAL FIELD

The present invention relates generally to a system and method for an electronic system, and, in particular embodiments, to an RF amplifier.

BACKGROUND

Wireless systems, such as wireless handheld devices and WiFi enabled appliances, continue to become ubiquitous. In addition to becoming more common, much effort has been expended in reducing the power consumption of such wireless devices in order to shrink their size, lower their operating temperature, make them more suitable for battery operation, and reduce their cost.

In many wireless systems, a significant portion of the power used during operation is the power consumed by the radio frequency (RF) power amplifier used to transmit wireless signals. Because the RF power amplifier uses such a large portion of the system power budget, much work has been done to improve the power efficiency of RF power amplifiers.

In many situations, the architecture of the power amplifier can be selected based on the type of signaling required by the RF system. For example, signals having a high peak-to-average ratio, such as orthogonal frequency-division multiplexing (OFDM), RF amplifiers using multiple amplifiers, such as a Doherty amplifier, can be used to improve power efficiency.

A Doherty amplifier generally includes two amplifiers that operate in parallel. The first amplifier is referred to as a "carrier amplifier" for relatively low signal levels, while the second amplifier is referred to as a "peak amplifier" that is used during periods of high signal levels, but is shut down during relatively low signal level periods. Since signals having a high peak-to-average ratio have tend to have a lower proportion of high amplitude signals compared to low amplitude signals, causing the peak amplifier to be inactive during periods of lower amplitude signal activity may save a significant amount of power.

SUMMARY

In accordance with an embodiment, an RF amplifier includes: a first amplifier including a first transistor coupled to a first supply node configured to provide a first supply voltage, the first transistor having a first device periphery; a second amplifier including a second transistor coupled to a second supply node configured to provide a second supply voltage higher than the first supply voltage, the second transistor having a second device periphery; and a combining network coupled to an output of the first amplifier, an output of the second amplifier, and an RF output port. The first device periphery, the first supply voltage, the second device periphery, and the second supply voltage are configured to maintain a junction temperature ratio of between 0.3 and 1.0, and the junction temperature ratio is a ratio of a temperature of the first amplifier to a temperature of the second amplifier.

In accordance with another embodiment, a method includes: providing a first supply voltage to a first amplifier comprising a comprising a first transistor having a first device periphery; providing a second supply voltage to a second amplifier comprising a second transistor having a second device periphery smaller than the first device periphery, wherein the second supply voltage is higher than the first supply voltage; providing an RF input signal to inputs of the first amplifier and the second amplifier; amplifying the RF input signal using the first amplifier and the second amplifier; and combining an output of the first amplifier with an output of the second amplifier using a combining network to form an RF output signal. The first device periphery, the first supply voltage, the second device periphery, and the second supply voltage are configured to maintain a junction temperature ratio of between 0.3 and to 1.0, and the junction temperature ratio is a ratio of a temperature of the first amplifier to a temperature of the second amplifier.

In accordance with a further embodiment, an amplifier includes: a first gallium nitride (GaN) transistor coupled to a first supply node configured to receive a first supply voltage and having a first device periphery; a second GaN transistor coupled to a second supply node configured to receive a second supply voltage higher than the first supply voltage and having a second device periphery smaller than the first device periphery, wherein the second GaN transistor is biased as a class C amplifier; an input network coupled to an input port, a control node of the first GaN transistor, and a control node of the second GaN transistor; and a combining network coupled to an output port, an output node of the first GaN transistor, and an output node of the second GaN transistor. The first device periphery, the first supply voltage, the second device periphery, and the second supply voltage are configured to maintain a junction temperature ratio of between 0.3 and 1.0, for an RF input signal having a given peak-to-average ratio, and the junction temperature ratio is a ratio of a temperature of the first GaN transistor to a temperature of the second GaN transistor.

BRIEF DESCRIPTION OF THE DRAWINGS

For a more complete understanding of the present invention, and the advantages thereof, reference is now made to the following descriptions taken in conjunction with the accompanying drawings, in which.

Corresponding numerals and symbols in different figures generally refer to corresponding parts unless otherwise indicated. The figures are drawn to clearly illustrate the relevant aspects of the preferred embodiments and are not necessarily drawn to scale. To more clearly illustrate certain embodiments, a letter indicating variations of the same structure, material, or process step may follow a figure number.

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

In accordance with an embodiment, an RF amplifier has a first amplifier that functions as a carrier or main amplifier, and a second amplifier that functions as a peak amplifier. In some embodiments, the first and second amplifiers are implemented using GaN transistors. By coupling the second amplifier to a higher supply voltage than the first amplifier, and by sizing the device periphery of the second amplifier to be smaller than the device periphery of the first amplifier, the temperature of the first amplifier can be made to be similar to the second amplifier. In some embodiments, the ratio of the temperature of the second amplifier to the first amplifier can be made to be between 0.3 and 1.0 for a given peak-to-average ratio of an RF input signal. Alternatively, peak-to-average ratios outside of this range may also be used. Because the device periphery of the second amplifier (e.g. the peak amplifier) is smaller than the device periphery of the first amplifier, embodiment amplifier can be made to be area efficient and cost effective.

Figure 1A:
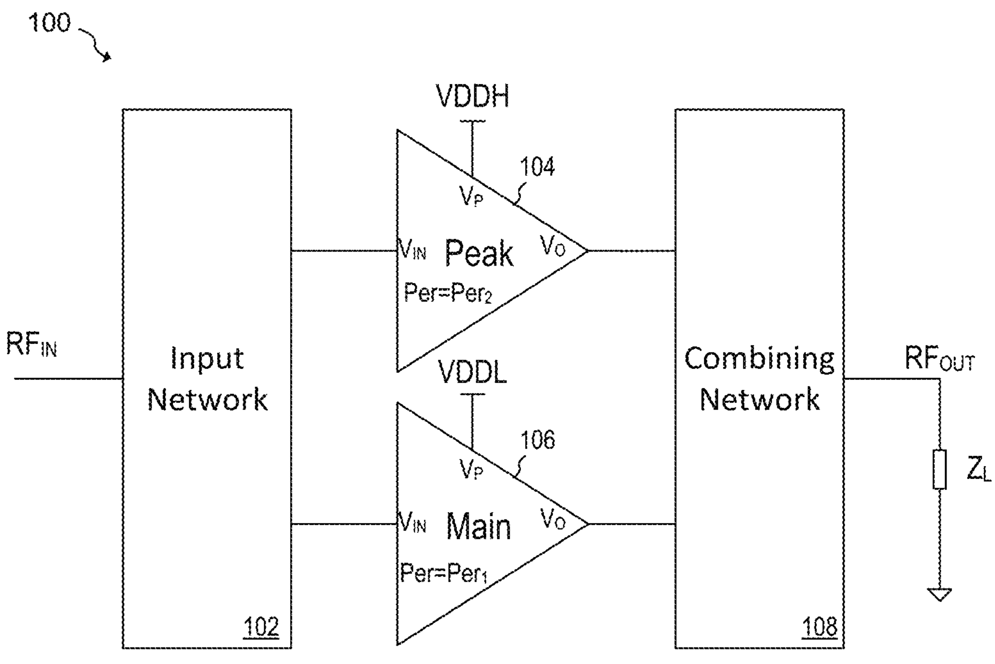
FIG. 1A illustrates an amplifier according to an embodiment of the present invention.

FIG. 1A illustrates an amplifier 100 according to an embodiment of the present invention. As shown, amplifier 100 includes input network 102, peak amplifier 104, main amplifier 106 and combining network 108. In various embodiments, input network 102 splits RF input signal $RF_{IN}$ coupled to an RF input port of input network 102 into two signals. The first signal is input to the input of peak amplifier 104, and the second signal is input to the input of main amplifier 106. In some embodiments, input network 102 may also include one or more RF matching networks and/or one or more phase shifting networks. Combining network 108 combines the outputs of amplifiers 104 and 106 into a single RF output signal $RF_{OUT}$ that is provided by an RF output port of combining network 108. As shown, output signal $RF_{OUT}$ is provided to a load impedance $Z_L$. It should be understood that load impedance $Z_L$ represents an impedance seen by the output of combining network 108, and may not necessarily be implemented by a physical resistor. In some embodiments, combining network 108 may also include one or more RF matching networks and/or one or more phase shifting networks.

In an embodiment, main amplifier 106 is configured to amplify input signals having a relatively low input power, while peak amplifier 104 is configured to amplify input signals having higher input powers. As such, main amplifier 106 may be configured as a class A, class B, or a class AB amplifier, while peak amplifier 104 may be configured as a class C amplifier.

In various embodiments, peak amplifier 104 has a smaller device periphery $Per_2$ (also referred to as "gate periphery") than that device periphery $Per_1$ of main amplifier 106, yet peak amplifier 104 is operated using a power supply voltage VDDH that is higher than the power supply voltage VDDL supplied to main amplifier 106. Because peak amplifier 104 operates at a lower duty cycle than main amplifier 106, it is possible to operate peak amplifier 104 at a higher voltage and using a smaller device periphery compared to main amplifier 106 while maintaining good device reliability.

$$I_1 \cong \frac{I_{sat}}{2} * Per_1 I_2 \cong \frac{I_{sat}}{2} * \frac{Per_{main}}{x}$$

Assuming that main amplifier 106 and peak amplifier 104 are implemented using a FET device, such as a GaN MESFET or HEMT, power dissipated by main amplifier 106 can be expressed as:

$$I_1 \cong \frac{I_{sat}}{2} * Per_1 I_2 \cong \frac{I_{sat}}{2} * \frac{Per_{main}}{x} P_1 = I_1 V_1,$$

$$I_1 \cong \frac{I_{sat}}{2} * Per_1 I_2 \cong \frac{I_{sat}}{2} * \frac{Per_{main}}{x}$$

where $P_1$, $I_1$ and $V_1$ represent the fundamental Fourier components of the power, current and voltage of main amplifier 106. Similarly, the power dissipated by peak amplifier 104 can be expressed as:

$$I_1 \cong \frac{I_{sat}}{2} * Per_1 I_2 \cong \frac{I_{sat}}{2} * \frac{Per_{main}}{x} P_2 = I_2 V_2,$$

$$I_1 \cong \frac{I_{sat}}{2} * Per_1 I_2 \cong \frac{I_{sat}}{2} * \frac{Per_{main}}{x}$$

where $P_2$, $I_2$ and $V_2$ represent the fundamental Fourier components of the power, current and voltage of main amplifier 106. Current $I_1$ of main amplifier 106 can be expressed as:

$$I_1 \cong \frac{I_{sat}}{2} * Per_1 I_2 \cong \frac{I_{sat}}{2} * \frac{Per_{main}}{x},$$

$$I_1 \cong \frac{I_{sat}}{2} * Per_1 I_2 \cong \frac{I_{sat}}{2} * \frac{Per_{main}}{x}$$

where $I_{sat}$ is the saturation current and $Per_1$ is the gate periphery of main amplifier 106. Assuming that peak amplifier 104 has the same saturation current $I_{sat}$ as main amplifier 106, but a gate periphery $Per_{peak}$ that is a factor of x less than the gate periphery $Per_{main}$ of main amplifier 106, Current $I_2$ of peak amplifier 104 can be expressed as:

$$I_1 \cong \frac{I_{sat}}{2} * Per_1 I_2 \cong \frac{I_{sat}}{2} * \frac{Per_{main}}{x}.$$

$$P_1 \cong \frac{I_{sat}}{2} * Per_{main} * V_1 P_2 \cong \frac{I_{sat}}{2} * \frac{Per_{main}}{x} * V_1 * x \cong P_1$$

If peak amplifier 104 is operated at a voltage that is a factor of x greater than main amplifier 106, it can be further shown that:

$$P_1 \cong \frac{I_{sat}}{2} * Per_{main} * V_1 P_2 \cong \frac{I_{sat}}{2} * \frac{Per_{main}}{x} * V_1 * x \cong P_1$$

$$P_1 \cong \frac{I_{sat}}{2} * Per_{main} * V_1 P_2 \cong \frac{I_{sat}}{2} * \frac{Per_{main}}{x} * V_1 * x \cong P_1.$$

$$P_1 \cong \frac{I_{sat}}{2} * Per_{main} * V_1 P_2 \cong \frac{I_{sat}}{2} * \frac{Per_{main}}{x} * V_1 * x \cong P_1$$

Thus, the voltage and periphery of peak amplifier 104 can be adjusted in a manner that is inversely proportional to each other while maintaining a same power dissipation. Having a such a reduction in gate periphery allows for a reduction in the device size of peak amplifier 104, as well as a corresponding reduction in cost.

$$T_j = Rth * Pdiss T_j = Rth(\text{Area}) * \frac{Iout(\text{Area}) * 2Vdc}{Eff} Pdiss$$

During operation, main amplifier 106 and peak amplifier 104 will operate at a particular junction temperature $T_j$: which can be expressed as:

$$T_j = Rth * Pdiss T_j = Rth(\text{Area}) * \frac{Iout(\text{Area}) * 2Vdc}{Eff} Pdiss,$$

$$T_j = Rth * Pdiss T_j = Rth(\text{Area}) * \frac{Iout(\text{Area}) * 2Vdc}{Eff} Pdiss$$

where Rth is the thermal resistance and Pdiss is the dissipated power of the respective amplifier. The junction temperature can also be express as a function of chip area Area, RF output power, and the efficiency Eff of generating this power:

$$T_j = Rth * Pdiss T_j = Rth(\text{Area}) * \frac{Iout(\text{Area}) * 2Vdc}{Eff} Pdiss,$$

$$T_j = Rth * Pdiss T_j = Rth(\text{Area}) * \frac{Iout(\text{Area}) * 2Vdc}{Eff} Pdiss$$

where Iout(Area) is the output current of the respective amplifier as a function of chip area, and Vdc is the de voltage applied to the respective amplifier. It is apparent, however, from the equation above, that increasing the de voltage applied to an amplifier increases its junction temperature, which, in turn, will decrease its mean time to failure resulting in a decreased lifetime if the average power of peak amplifier 104 is the same as the average power of main amplifier 106. However, when peak amplifier 104 operates at a lower average power, lower junction temperatures can be achieved.

Figure 1B:
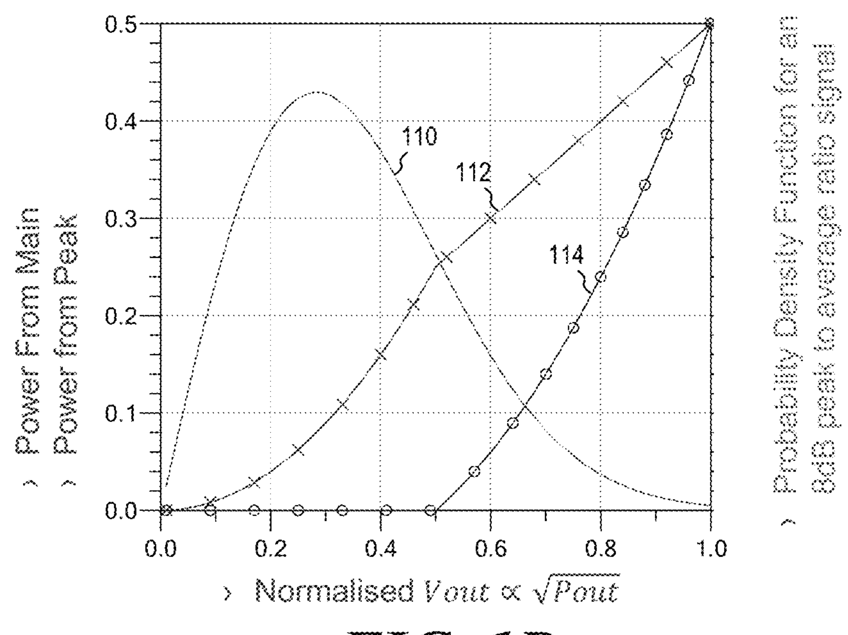
FIG. 1B illustrates a graph showing the relationship between the probability density function of an input signal having a high peak-to-average ratio and the relative output powers of an embodiment main amplifier and peak amplifier.

In various embodiments, the ratio of average power delivered by peak amplifier 104 and main amplifier 106 is asymmetric such that peak amplifier 104 delivers a lower average power than main amplifier 106. However, in some embodiments, both main amplifier 106 and peak amplifier 104 is configured to deliver the same peak power. The particular ratio of average power is a function of the input signal $RF_{IN}$ being amplifier by amplifier 100. For example, FIG. 1B depicts the relationship between the probability density function of an input signal having a high peak-to-average ratio and the relative output powers of peak amplifier 104 and main amplifier 106. Trace 110 represents the probability density function of a modulated signal, such as OFDM, having an 8 dB peak to average ratio, trace 112 represents the power provided by main amplifier 106 with respect to the normalized voltage output, and trace 114 represents the power provided by peak amplifier 104 with respect to the normalized voltage output. It is apparent from the graph of FIG. 1B, that main amplifier 106 and peak amplifier 104 are configured to provide the same normalized peak output power of 0.5 when the normalized power output is 1.0. It can be further shown that input signals having higher peak-to-average ratios result in amplifier circuits have having a lower ratio between the average power of peak amplifier 104 and the average power of main amplifier 106 even though both amplifiers are configured to provide the same peak output.

$$\frac{T_{Jmain}}{T_{Jpeak}} = \frac{Rth(\text{Area}_{main}) * \frac{Iout_{ave,main}(\text{Area}) * 2Vdc_{main}}{Eff_{main}}}{Rth(\text{Area}_{peak}) * \frac{\beta.Iout_{ave,peak}(\text{Area}) * 2Vdc_{peak}}{Eff_{peak}}} = 1$$

In embodiments of the present invention, the ratio of the junction temperatures of the main amplifier 106 to peak amplifier 104 can be expressed as:

$$\frac{T_{Jmain}}{T_{Jpeak}} = \frac{Rth(\text{Area}_{main}) * \frac{Iout_{ave,main}(\text{Area}) * 2Vdc_{main}}{Eff_{main}}}{Rth(\text{Area}_{peak}) * \frac{\beta.Iout_{ave,peak}(\text{Area}) * 2Vdc_{peak}}{Eff_{peak}}} = 1,$$

$$\frac{T_{Jmain}}{T_{Jpeak}} = \frac{Rth(\text{Area}_{main}) * \frac{Iout_{ave,main}(\text{Area}) * 2Vdc_{main}}{Eff_{main}}}{Rth(\text{Area}_{peak}) * \frac{\beta.Iout_{ave,peak}(\text{Area}) * 2Vdc_{peak}}{Eff_{peak}}} = 1$$

where $T_{Jmain}$ is the junction temperature of main amplifier 106, $T_{Jpeak}$ is the junction temperature of peak amplifier 104, $Rth(\text{Area}_{main})$ is the thermal resistance of main amplifier 106 as a function of its device area, $Rth(\text{Area}_{peak})$ is the thermal resistance of peak amplifier 104 as a function of its device area, $Iout_{ave,main}$(Area) is the average current of main amplifier 106 as a function of its device area, $Iout_{ave,peak}$(Area) is the average current of peak amplifier 104 as a function of its device area, $Eff_{main}$ is the efficiency of main amplifier 106, $Eff_{peak}$ is the efficiency of peak amplifier 104, $Vdc_{main}$ is the supply voltage applied to main amplifier 106, $Vdc_{peak}$ the supply voltage applied to peak amplifier 104, and β is the power ratio between peak amplifier 104 and main amplifier 106. Power ratio β is a function of the peak-to-average ratio of the input signal to amplifier 100, as well as a function of how peak amplifier 104 is biased. In various embodiments, power ratio β is generally less than 1 and typically less than 0.25.

$$\frac{T_{Jmain}}{T_{jpeak}} = 1$$

In order to configure main amplifier 106 and peak amplifier 104 to produce the same peak output power, both devices would be configured to have the same device area or gate periphery (e.g., gate width) when each amplifier uses the same supply voltage. However, once peak amplifier 104 is configured to have a different supply voltage from main amplifier 106, peak amplifier 104 can have a smaller device area or gate periphery and still maintain the same peak power output. Advantageously, a smaller device area can be selected for peak amplifier 104 such that peak amplifier provides not only at least the same peak power output as main amplifier 106, but can also operate at the same junction temperature as main amplifier 106 such that:

$$\frac{T_{Jmain}}{T_{jpeak}} = 1.$$

$$\frac{T_{Jmain}}{T_{jpeak}} = 1$$

By configuring peak amplifier 104 to have the same or similar device junction temperature as main amplifier 106, a smaller device area can be used, which advantageously leads to a smaller chip area and a lower cost for amplifier 100.

Amplifier 100 depicted in FIG. 1A may be adapted for use in various applications. For example, amplifier 100 may be used in wireless infrastructure systems. In such systems, amplifier 100 may be configured to operate over frequencies between 400 MHz and 6 GHz and output between 2 W and 1000 W of power. Amplifier 100 may also be used in ground-based radar applications that transmit between 5 W and 2000 W of power at frequencies between 1 GHz and 40 GHz, or may be used in airborne radar applications that transmit between 100 W and 1000 W of power at frequencies between 2 GHz and 4 GHz.

Main amplifier 106 and peak amplifier 104 may be implemented using RF amplifier topologies known in the art. For example, these amplifiers may be implemented using GaN high-electron mobility transistor (HEMT) or MESFET such as RF amplifier 120 illustrated in FIG. 1C. As shown, RF amplifier 120 includes a GaN transistor 128 coupled to input node $V_{IN}$ via coupling capacitor 122. Bias voltage $V_{BIAS}$ is provided to the gate (also referred to as a "control node") of GaN transistor 128 via inductor 124. The drain of GaN transistor 128 is coupled to power supply node $V_P$ via inductor 126. In some embodiments, coupling capacitor 122 may be omitted depending on the structure of input network 102 shown in FIG. 1A. In various embodiments, GaN transistor 128 may be implemented using a GaN MESFET or a GaN HEMT.

In various embodiments, bias voltage $V_{BIAS}$ can be selected in order to bias RF amplifier 120 in a desired region or class of operation. For example, a higher bias voltage $V_{BIAS}$ may be selected in order to bias RF amplifier 120 in a class A, class B or class AB region of operation suitable for use for main amplifier 106, and a lower bias voltage $V_{BIAS}$ may be selected in order to bias RF amplifier 120 in a class C region of operation suitable for use for peak amplifier 104. The gate periphery (e.g. gate width) of GaN transistor 128 may be selected such that the gate periphery of peak amplifier 104 is smaller than the gate periphery of main amplifier 106, and the junction temperature of peak amplifier 104 is similar to the junction temperature of main amplifier 106 as described above.

Figure 1C:
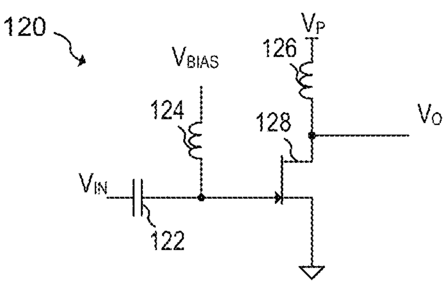
FIG. 1C illustrates an embodiment amplifier that utilizes a gallium nitride (GaN) transistor.
Figure 1D:
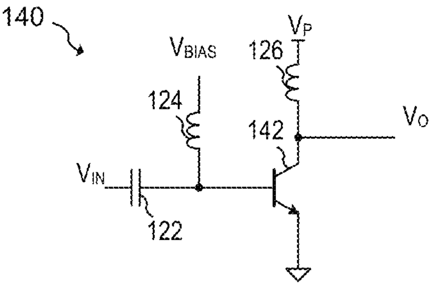
FIG. 1D illustrates an embodiment amplifier that utilizes a bipolar junction transistor.

In an alternative embodiment, main amplifier 106 and peak amplifier 104 may be implemented using a bipolar transistor as illustrated in FIG. 1D showing RF amplifier 140 that includes bipolar transistor 142. The function of capacitor 122 and inductors 124 and 126 is similar to that of RF amplifier 120 shown in FIG. 1C. In various embodiments, the emitter area of bipolar transistor 142 is selected such that the emitter area of peak amplifier 104 is smaller than the emitter of main amplifier 106, and the junction temperature of peak amplifier 104 is similar to the junction temperature of main amplifier 106 as described above.

It should be appreciated that RF amplifier 120 shown in FIG. 1C and RF amplifier 140 shown in FIG. 1D are only two of many possible RF amplifier topologies that could be used to implement main amplifier 106 and peak amplifier 104.

Figure 2A:
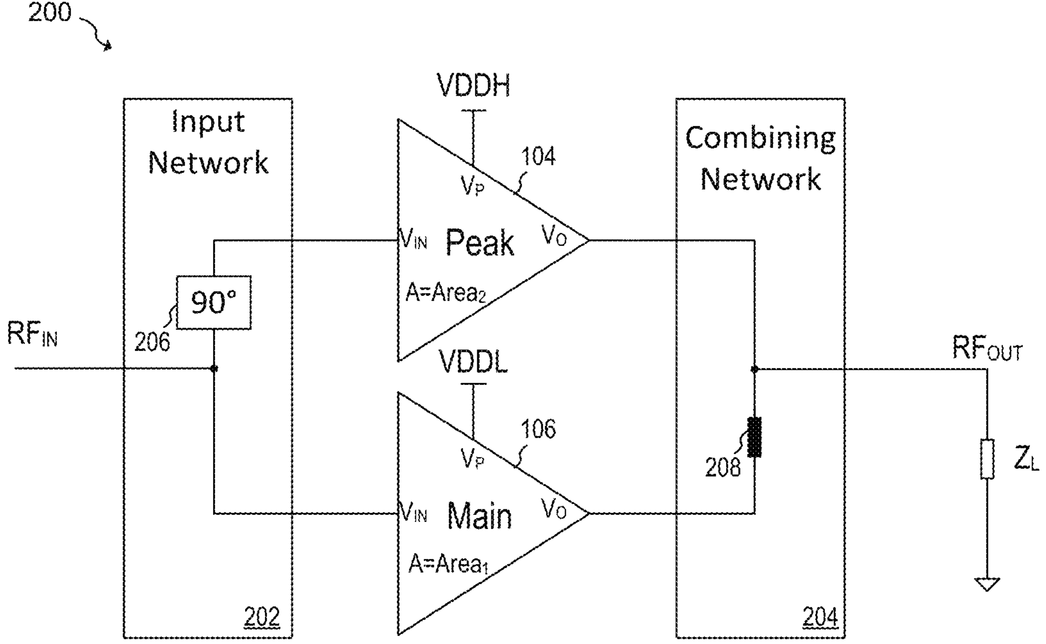
FIGS. 2A, 2B, 2C and 2D illustrate schematics of embodiment amplifiers.

Embodiment amplifier 100 shown in FIG. 1A can be implemented in a variety of different fashions. For example, FIG. 2A illustrates amplifier 200 configured as a Doherty amplifier. As shown, input network 102 of FIG. 1A is implemented using input network 202 that includes phase shifter 206 coupled between RF input $RF_{IN}$ and the input of peak amplifier 104, which can be implemented using phase shifter circuits known in the art. As non-limiting examples, phase shifter 206 could be implemented using a transmission line element or a lumped element circuit that provides a 90 degree phase shift. Alternatively, input network 202 could be implemented a circuit, such as a hybrid coupler or polyphase filter that establishes a 90 degree phase difference between the inputs of main amplifier 106 and peak amplifier 104.

$$Z_T = \left(\frac{Per_{peak}}{Per_{main}} + 1\right)\frac{Vdc_{main}Vdc_{peak}}{2Pout_{total}}$$

Combining network 108 of FIG. 1A is implemented using combining network 204 that includes transmission line element 208 coupled between the output of main amplifier 106 and output node $RF_{OUT}$, which functions as an impedance inverter. The objective of transmission line element 208 is to simultaneously match the outputs of the peak amplifier 104, main amplifier 106 and output node $RF_{OUT}$ to each other, as well as provide a 90 degree phase shift. In an embodiment, the impedance $Z_T$ of transmission line element 208 can be set as follows:

$$Z_T = \left(\frac{Per_{peak}}{Per_{main}} + 1\right)\frac{Vdc_{main}Vdc_{peak}}{2Pout_{total}},$$

$$Z_T = \left(\frac{Per_{peak}}{Per_{main}} + 1\right)\frac{Vdc_{main}Vdc_{peak}}{2Pout_{total}}$$

where $Pout_{Total}$ is the total peak power output of amplifier 200. From the equation above, it can be seen that impedance $Z_T$ of transmission line element 208 is a function of the de voltages to be applied to the amplifier. Moreover, it should be understood that the amplifier 200 shown in FIG. 2A is one of many possible ways of implementing an embodiment Doherty amplifier. For example, additional matching elements, such as transmission line elements (not shown) may be used. In one alternative embodiment, an additional transmission line element is coupled in series with the output of peak amplifier 104 and main amplifier 106 and/or an additional transmission line element may be placed in series with load impedance $Z_L$. The selection of impedances of these additional transmission line elements and/or the selection of additional matching networks may be performed using impedance matching and Doherty amplifier design techniques known in the art.

Figure 2B:
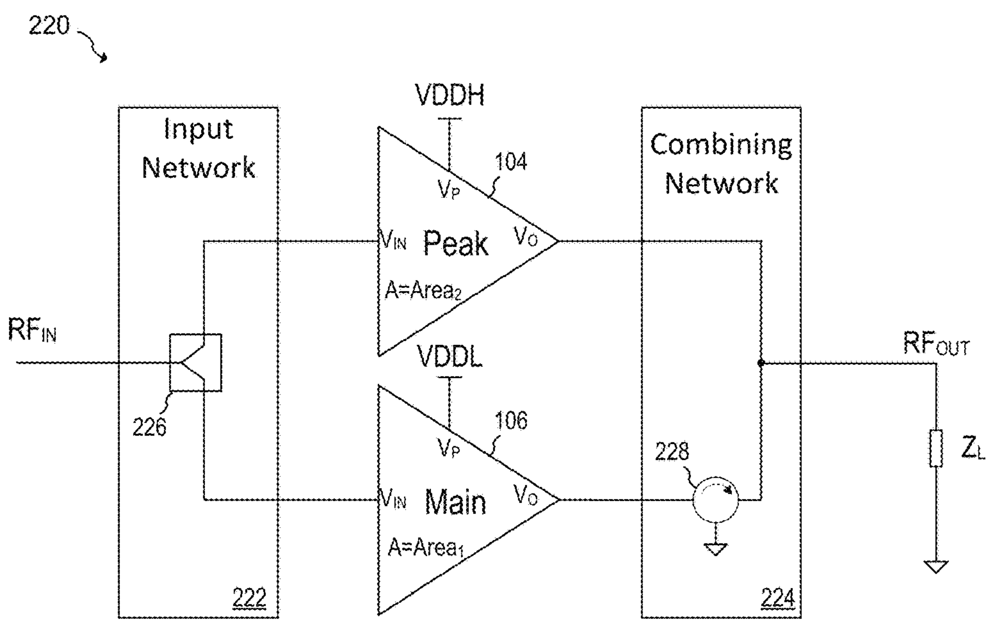

FIG. 2B illustrates amplifier 220 according to a further embodiment that utilizes a Chirex structure. As shown, input network 102 of FIG. 1A is implemented using input network 222 that includes a power splitter 226 configured to divide the power received at input node $RF_{IN}$ and provide the divided input power to the input of main amplifier 106 and the input of peak amplifier 104. Combining network 108 of FIG. 1A is implemented using combining network 224 that includes a circulator coupled between the output of main amplifier 106 and output node $RF_{OUT}$. Power splitter 226 can be implemented using power splitter circuits known in the art, including, but not limited to a Wilkinson power divider or a hybrid power divider. Circulator 228 may be implemented using circulator circuits known in the art, such as ferrite-based, or nonreciprocal switched transmission line-based circuits.

Figure 2C:
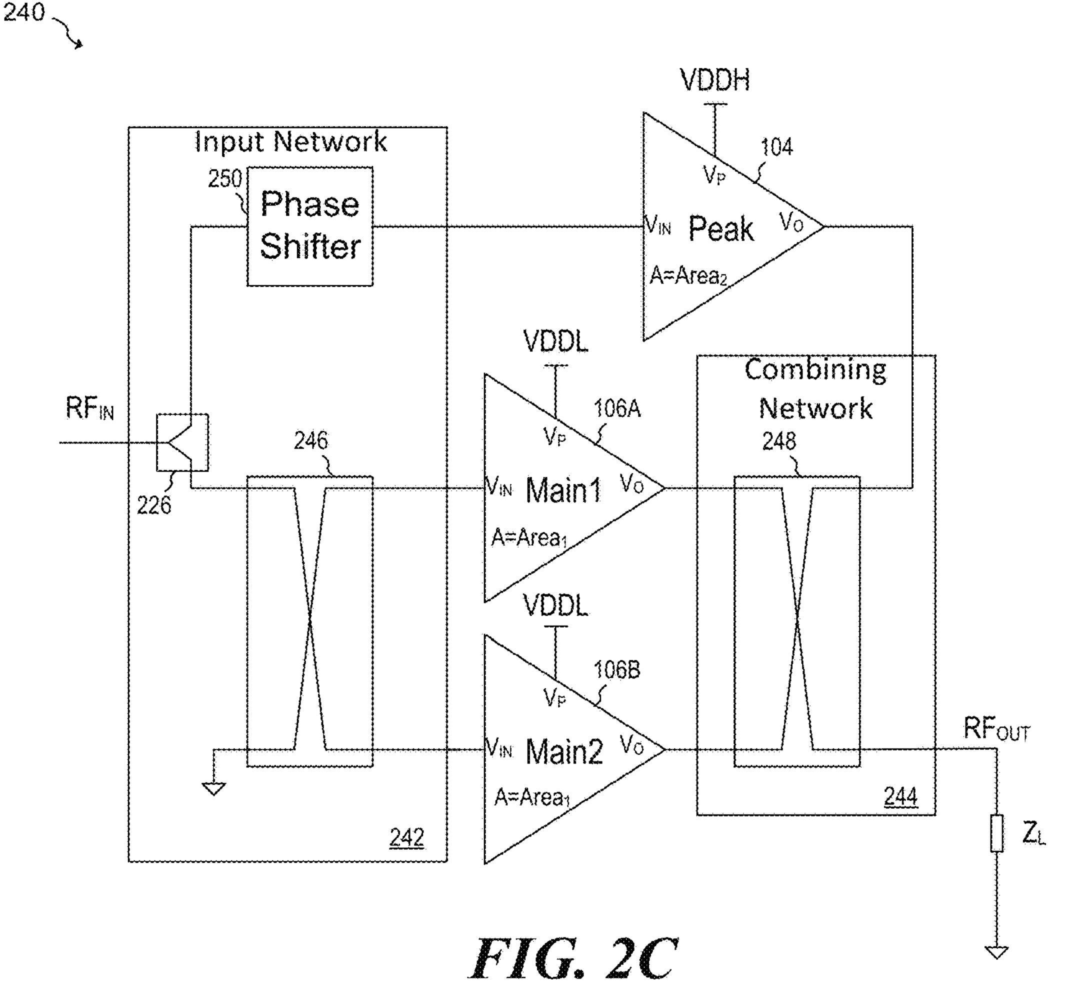

FIG. 2C illustrates amplifier 220 according to a further embodiment that utilizes a load modulated balanced amplifier (LMBA) structure. As shown, amplifier 220 includes a balanced amplifier formed by main amplifiers 106A and 106B that are both coupled to low voltage power supply node VDDL, and a peak amplifier 104 (also referred to as a "control amplifier") coupled to higher voltage power supply node VDDH. Main amplifiers 106A and 106B may also be collectively referred to as a "main amplifier." Input network 242 splits the power received via input node $RF_{IN}$ into three signals that are respectively provided to the inputs of peak amplifier 104, main amplifier 106A, and main amplifier 106B. Combining network combines the outputs of peak amplifier 104, main amplifier 106A, and main amplifier 106B, and provides the combined outputs to output node $RF_{OUT}$.

Input network 222 includes a power splitter 226, phase shifter 250, and quadrature coupler 246. Power splitter 226 divides the power received from node $RF_{IN}$ and provides the divided power to phase shifter 250 and quadrature coupler 246. Input power splitter 250 shifts the phase of by o degrees between peak amplifier 104 and main amplifier 106. Quadrature coupler 246 further divides the output of power splitter 226 and provides the further divided output to main amplifiers 106A and 106B. In various embodiments, the outputs of quadrature coupler 246 are 90 degrees out of phase with each other. While one of the ports of quadrature coupler 246 is shown coupled to ground, it should be understood that this port could be coupled to any suitable reference node.

Combining network includes quadrature coupler 248 that combines the outputs of main amplifier 106A, main amplifier 106B, and peak amplifier 104, and provides the combined outputs to output node $RF_{OUT}$.

During operation, main amplifiers 106A and 106B and peak amplifier 104 operate according to the principles described above with respect to FIGS. 1A to 1D. For example, main amplifiers 106A and 106B may be biased for class A or class AB operation and peak amplifier 104 is biased for class C operation. Moreover, by biasing peak amplifier 104 with a higher voltage than main amplifiers 106A and 106B, and by making device area $Area_2$ of peak amplifier 104 smaller than device area Areal of main amplifiers 106A and 106B, such that the junction temperatures of all amplifiers are similar, the physical size of peak amplifier 104 can be reduced.

Figure 2D:
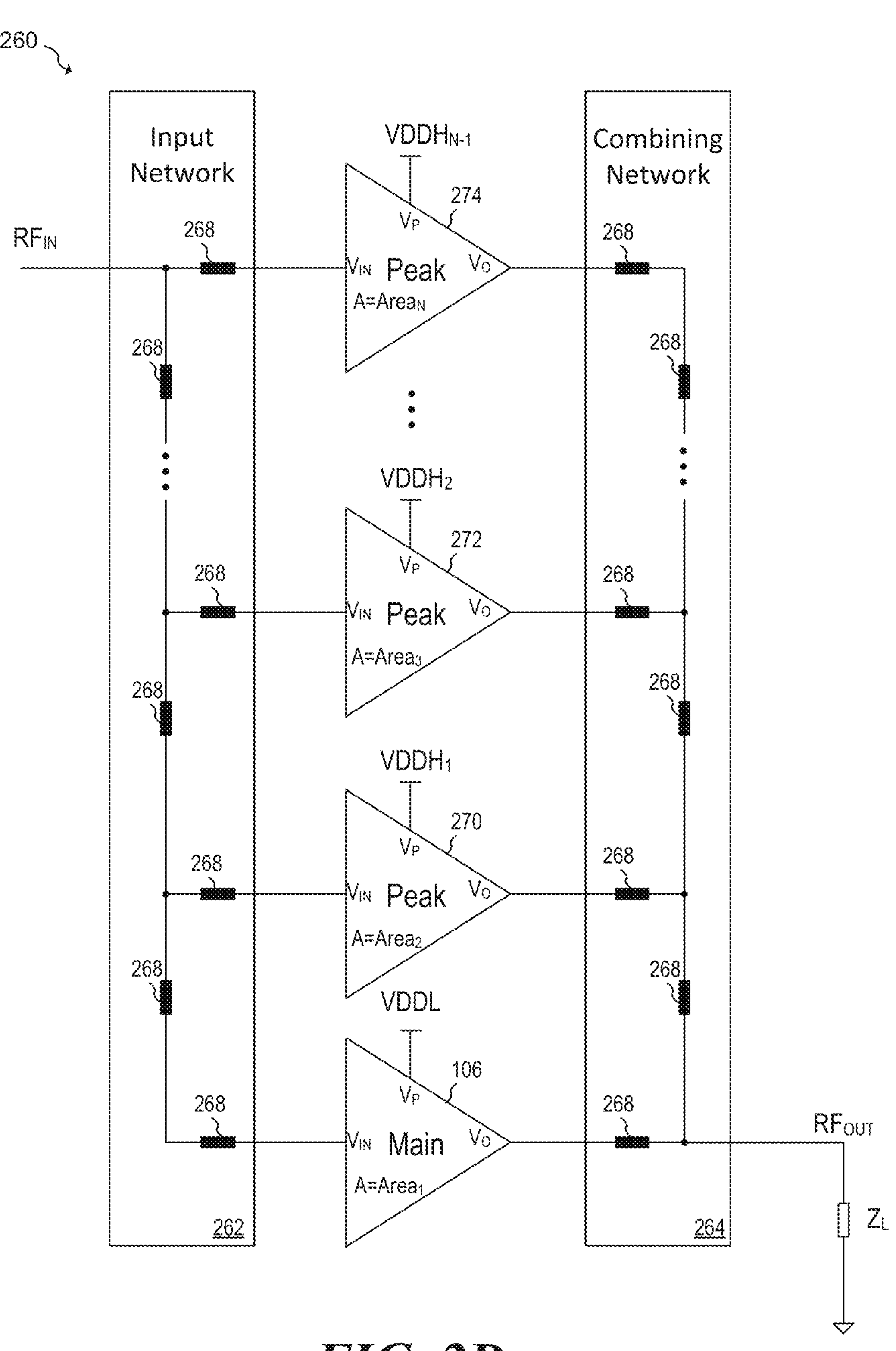

In embodiments, of the present invention, the number of peak amplifiers can be increased to provide successively higher peak voltages and higher dynamic range using embodiment efficiency enhancement techniques as shown in FIG. 2D, which illustrates an embodiment N-way Doherty amplifier 260. As shown, N-way Doherty amplifier 260 includes main amplifier 106 coupled to supply voltage VDDL, and N−1 peak amplifiers 270, 272 . . . 274 respectively coupled to supply voltages $VDDH_1$, $VDDH_2$ . . . $VDDH_{N-1}$, where N is an integer three or greater. In various embodiments, supply voltages $VDDH_1$, $VDDH_2$ . . . $VDDH_{N-1}$ are configured to provide successively higher supply voltages. For example, the voltage of $VDDH_1$ is greater than the voltage of VDDL, the voltage of $VDDH_1$ is greater than the voltage of $VDDH_2$, and the voltage of $VDDH_{N-1}$, is greater than the voltage of $VDDH_2$. Each peak amplifier 270, 272 . . . 274 has an associated device area $Area_2$, $Area_3$ . . . $Area_N$. The supply voltage values for VDDL and $VDDH_1$, $VDDH_2$ . . . $VDDH_{N-1}$, and device areas $Area_2$, $Area_3$ . . . $Area_N$ may be determined based on the output requirements of the amplifier and the embodiment design principles described above with respect to FIGS. 1A, 1B and 1C.

As shown, input network 262 coupled between input node RFIN and the inputs of amplifiers 106, 270, 272 . . . 274 includes a plurality of transmission line elements 268 arranged in a ladder configuration. Similarly, combining network 264 coupled between amplifiers 106, 270, 272 . . . 274 and RF output node $RF_{OUT}$ includes a plurality of transmission line elements 268 arranged in a ladder configuration. In various embodiments, each transmission line element 268 is sized to provide about a 90-degree phase shift at the signal frequency of amplifier 260.

It should be understood that the examples shown and described above in FIGS. 2A, 2B, 2C and 2D are only a few possible ways to implement embodiment amplifiers. In alternative embodiments, other input network and combining network structures that respectively split input power, distribute input power to multiple amplifiers, and combine the output power of the multiple amplifiers could be used to implement embodiments of the present invention.

Figure 3:
FIG. 3 illustrates a flowchart of a method of operating an embodiment amplifier.
Figure 3:
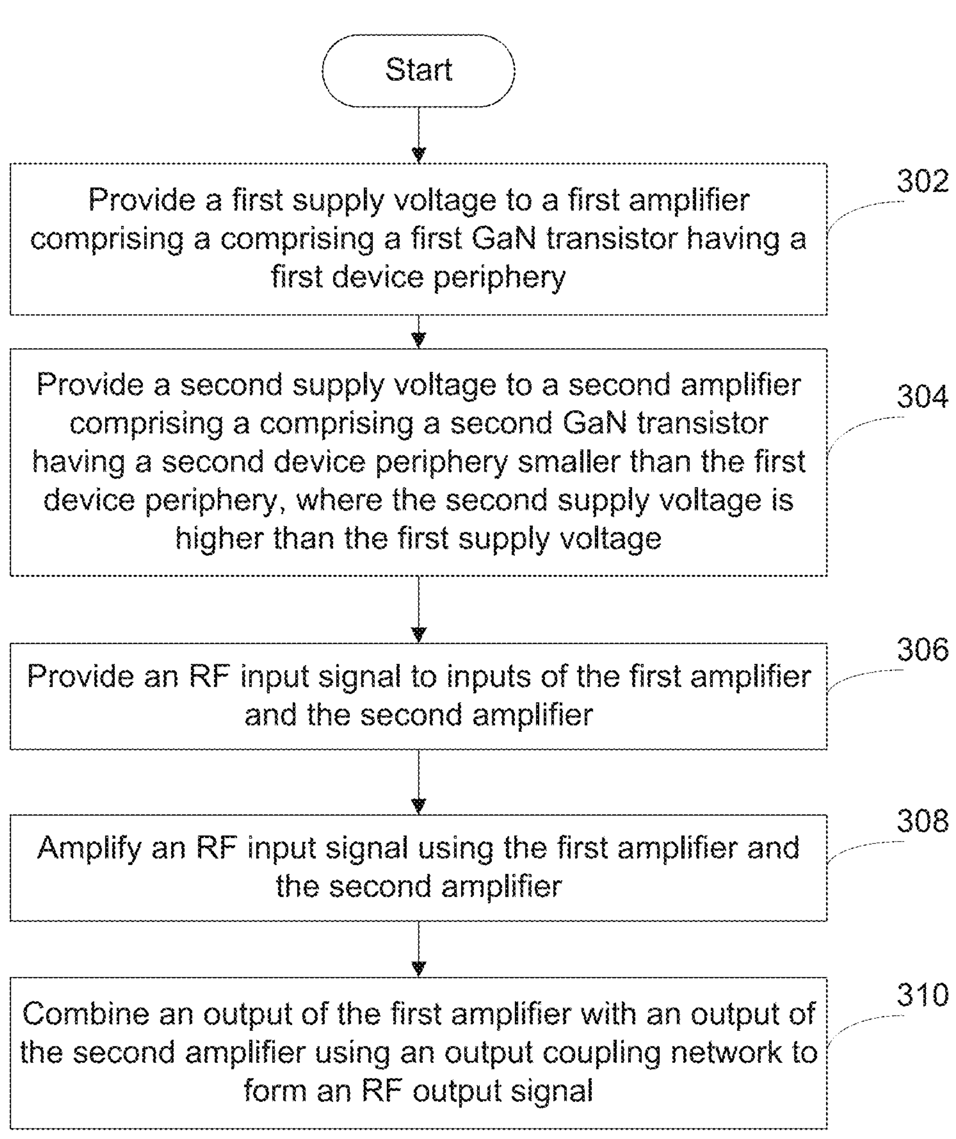

FIG. 3 illustrates a method 300 of operating an embodiment amplifier according to an embodiment of the present invention. In step 302, a first supply voltage is provided to a first amplifier, and in step 304, a second supply voltage is provided to a second amplifier. In various embodiments, the first amplifier and the second amplifier may be implemented as described above with respect to main amplifier 106 and peak amplifier 104, respectively. In one embodiment the first amplifier may be implemented using a first GaN transistor having a first device periphery and the second amplifier may be implemented using a second GaN transistor having a second device periphery, such that the second device periphery is smaller than the first device periphery and the second supply voltage is greater than the first supply voltage. Alternatively, other transistor types, such as bipolar transistors may be used as described above with respect to FIG. 2D.

In step 306, an RF input signal is provided to the inputs of the first amplifier and the second amplifier. In some embodiments, the RF input signal is provided to the inputs of the first amplifier and the second amplifier via an input network, such as input network 102, 202, 222 and 242 described above with respect to FIGS. 1A, 2A, 2B and 2C. In step 308, the RF input signal is respectively amplified by the first amplifier and the second amplifier.

In step 310, the outputs of the first amplifier and the second amplifier are combined to form an RF output signal. In various embodiments, these outputs may be combined using a combining network such as combining network 108, 204, 224 or 244 described above with respect to FIGS. 1A, 2A, 2B and 2C.

Embodiments of the present invention are summarized here. Other embodiments can also be understood from the entirety of the specification and the claims filed herein.

Example 1. An RF amplifier including: a first amplifier including a first transistor coupled to a first supply node configured to provide a first supply voltage, the first transistor having a first device periphery; a second amplifier including a second transistor coupled to a second supply node configured to provide a second supply voltage higher than the first supply voltage, the second transistor having a second device periphery; and a combining network coupled to an output of the first amplifier, an output of the second amplifier, and an RF output port, where: the first device periphery, the first supply voltage, the second device periphery, and the second supply voltage are configured to maintain a junction temperature ratio of between 0.3 and 1.0, and the junction temperature ratio is a ratio of a temperature of the first amplifier to a temperature of the second amplifier.

Example 2. The RF amplifier of example 1, where the first device periphery, the first supply voltage, the second device periphery, and the second supply voltage are configured such that first amplifier and the second amplifier deliver a same peak power.

Example 3. The RF amplifier of one of examples 1 or 2, where the first device periphery, the first supply voltage, the second device periphery, and the second supply voltage are configured to maintain the junction temperature ratio of between 0.3 and 1.0 for a first signal with a first probability density function.

Example 4. The RF amplifier of one of examples 1 to 3, where the first device periphery, the first supply voltage, the second device periphery, and the second supply voltage are configured to maintain the junction temperature ratio of between 0.3 and 1.0 for a given ratio of an average power provided by the second transistor to an average power provided by the first transistor.

Example 5. The RF amplifier of one of examples 1 to 4, further including an input network having a first input coupled to an RF input port, a first output coupled to an input of the first amplifier, and a second output coupled to an input of the second amplifier.

Example 6. The RF amplifier of one of examples 1 to 5, where: the combining network includes a first transmission line element having a first end coupled to the output of the second amplifier and a second end coupled to the output of the first amplifier and to the RF output port; and the input network includes a phase shifter coupled between the RF input port and the input of the first amplifier.

Example 7. The RF amplifier of one of examples 1 to 6, where: the combining network includes a circulator having a first port coupled to the output of the first amplifier and a second port coupled to the output of the second amplifier and to the RF output port; and the input network includes a power splitter having an input coupled to the RF input port, a first output coupled to the input of the first amplifier, and a second output coupled to the input of the second amplifier.

Example 8. The RF amplifier of one of examples 1 to 7, where the first amplifier further includes a third transistor coupled to the first supply node and having the first device periphery; the combining network includes a first quadrature coupler having a first port coupled to an output node of the first transistor, a second port coupled to an output node of the third transistor, a third port coupled to the output node of the second amplifier, and a fourth port coupled to the RF output port; and the input network includes a power splitter having an input coupled to the RF input port, a phase shifter coupled between a first output of the power splitter and the input of the second amplifier, and a second quadrature coupler having a first port coupled to a second output of the power splitter, a second port coupled to a reference node, a third port coupled to a control node of the first transistor and a fourth port coupled to a control node of the third transistor.

Example 9. The RF amplifier of one of examples 1 to 8, further including: a third amplifier including a third transistor coupled to a third supply node configured to provide a third supply voltage higher than the second supply voltage, the third transistor having a third device periphery, where: the combining network is further coupled to an output of the third amplifier, and the input network further including a third output coupled to an input of the third amplifier.

Example 10. The RF amplifier of one of examples 1 to 9, where: the third transistor includes a plurality of third transistors, and the third supply node includes a plurality of third supply nodes respectively coupled to the plurality of third transistors, where a first node of the plurality of third supply nodes is configured to provide a higher voltage than a second node of the plurality of third supply nodes.

Example 11. The RF amplifier of one of examples 1 to 10, where the second device periphery is smaller than the first device periphery.

Example 12. The RF amplifier of one of examples 1 to 11, where: the first transistor includes a first gallium nitride (GaN) transistor; and the second transistor includes a second GaN transistor.

Example 13. A method including: providing a first supply voltage to a first amplifier including a including a first transistor having a first device periphery; providing a second supply voltage to a second amplifier including a second transistor having a second device periphery smaller than the first device periphery, where the second supply voltage is higher than the first supply voltage; providing an RF input signal to inputs of the first amplifier and the second amplifier; amplifying the RF input signal using the first amplifier and the second amplifier; and combining an output of the first amplifier with an output of the second amplifier using a combining network to form an RF output signal, where the first device periphery, the first supply voltage, the second device periphery, and the second supply voltage are configured to maintain a junction temperature ratio of between 0.3 and 1.0, and the junction temperature ratio is a ratio of a temperature of the first amplifier to a temperature of the second amplifier.

Example 14. The method of example 13, further including: biasing the first amplifier as a class A, class B or class AB amplifier; and biasing the second amplifier as a class C amplifier.

Example 15. The method of one of examples 13 or 14, where the first device periphery, the first supply voltage, the second device periphery, and the second supply voltage are configured such that the first amplifier and the second amplifier deliver a same peak power.

Example 16. The method of one of examples 13 to 15, where the first device periphery, the first supply voltage, the second device periphery, and the second supply voltage are configured to maintain the junction temperature ratio of between 0.3 and 1.0 for a given power ratio between the second transistor and the first transistor.

Example 17. The method of one of examples 13 to 16, where the RF input signal has a peak-to-average ratio of at least 10 dB.

Example 18. The method of one of examples 13 to 17, further including coupling the RF input signal to inputs of the first amplifier and the second amplifier via an input network.

Example 19. The method of one of examples 13 to 18, where the first amplifier includes a plurality of first amplifiers.

Example 20. The method of one of examples 13 to 19, where the first amplifier, the second amplifier, and the combining network form a Doherty amplifier.

Example 21. The method of one of examples 13 to 20, where: the first transistor includes a first gallium nitride (GaN) transistor; and the second transistor includes a second GaN transistor.

Example 22. An amplifier including: a first gallium nitride (GaN) transistor coupled to a first supply node configured to receive a first supply voltage and having a first device periphery; a second GaN transistor coupled to a second supply node configured to receive a second supply voltage higher than the first supply voltage and having a second device periphery smaller than the first device periphery, where the second GaN transistor is biased as a class C amplifier; an input network coupled to an input port, a control node of the first GaN transistor, and a control node of the second GaN transistor; and a combining network coupled to an output port, an output node of the first GaN transistor, and an output node of the second GaN transistor, where the first device periphery, the first supply voltage, the second device periphery, and the second supply voltage are configured to maintain a junction temperature ratio of between 0.3 and 1.0, for an RF input signal having a given peak-to-average ratio, and the junction temperature ratio is a ratio of a temperature of the first GaN transistor to a temperature of the second GaN transistor.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. An RF amplifier comprising:

a first amplifier comprising a first transistor coupled to a first supply node configured to provide a first supply voltage, the first transistor having a first device periphery;

a second amplifier comprising a second transistor coupled to a second supply node configured to provide a second supply voltage higher than the first supply voltage, the second transistor having a second device periphery; and a combining network coupled to an output of the first amplifier, an output of the second amplifier, and an RF output port, wherein:

the first device periphery, the first supply voltage, the second device periphery, and the second supply voltage are configured to maintain a junction temperature ratio of between 0.3 and 1.0, and the junction temperature ratio is a ratio of a temperature of the first amplifier to a temperature of the second amplifier.

2. The RF amplifier of claim 1, wherein the first device periphery, the first supply voltage, the second device periphery, and the second supply voltage are configured such that the first amplifier and the second amplifier deliver a same peak power.

3. The RF amplifier of claim 1, wherein the first device periphery, the first supply voltage, the second device periphery, and the second supply voltage are configured to maintain the junction temperature ratio of between 0.3 and 1.0 for a first signal with a first probability density function.

4. The RF amplifier of claim 1, wherein the first device periphery, the first supply voltage, the second device periphery, and the second supply voltage are configured to maintain the junction temperature ratio of between 0.3 and 1.0 for a given ratio of an average power provided by the second transistor to an average power provided by the first transistor.

5. The RF amplifier of claim 1, further comprising an input network having a first input coupled to an RF input port, a first output coupled to an input of the first amplifier, and a second output coupled to an input of the second amplifier.

6. The RF amplifier of claim 5, wherein:

the combining network comprises a first transmission line element having a first end coupled to the output of the second amplifier and a second end coupled to the output of the first amplifier and to the RF output port; and the input network comprises a phase shifter coupled between the RF input port and the input of the first amplifier.

7. The RF amplifier of claim 5, wherein:

the combining network comprises a circulator having a first port coupled to the output of the first amplifier and a second port coupled to the output of the second amplifier and to the RF output port; and the input network comprises a power splitter having an input coupled to the RF input port, a first output coupled to the input of the first amplifier, and a second output coupled to the input of the second amplifier.

8. The RF amplifier of claim 5, wherein:

the first amplifier further comprises a third transistor coupled to the first supply node and having the first device periphery;

the combining network comprises a first quadrature coupler having a first port coupled to an output node of the first transistor, a second port coupled to an output node of the third transistor, a third port coupled to the output of the second amplifier, and a fourth port coupled to the RF output port; and the input network comprises a power splitter having an input coupled to the RF input port, a phase shifter coupled between a first output of the power splitter and the input of the second amplifier, and a second quadrature coupler having a first port coupled to a second output of the power splitter, a second port coupled to a reference node, a third port coupled to a control node of the first transistor and a fourth port coupled to a control node of the third transistor.

9. The RF amplifier of claim 5, further comprising:

a third amplifier comprising a third transistor coupled to a third supply node configured to provide a third supply voltage higher than the second supply voltage, the third transistor having a third device periphery, wherein:

the combining network is further coupled to an output of the third amplifier, and the input network further comprises a third output coupled to an input of the third amplifier.

10. The RF amplifier of claim 9, wherein:

the third transistor comprises a plurality of third transistors, and the third supply node comprises a plurality of third supply nodes respectively coupled to the plurality of third transistors, wherein a first node of the plurality of third supply nodes is configured to provide a higher voltage than a second node of the plurality of third supply nodes.

11. The RF amplifier of claim 1, wherein the second device periphery is smaller than the first device periphery.

12. The RF amplifier of claim 1, wherein:

the first transistor comprises a first gallium nitride (GaN) transistor; and the second transistor comprises a second GaN transistor.

13. A method comprising:

providing a first supply voltage to a first amplifier comprising a first transistor having a first device periphery;

providing a second supply voltage to a second amplifier comprising a second transistor having a second device periphery smaller than the first device periphery, wherein the second supply voltage is higher than the first supply voltage;

providing an RF input signal to inputs of the first amplifier and the second amplifier;

amplifying the RF input signal using the first amplifier and the second amplifier; and combining an output of the first amplifier with an output of the second amplifier using a combining network to form an RF output signal, wherein the first device periphery, the first supply voltage, the second device periphery, and the second supply voltage are configured to maintain a junction temperature ratio of between 0.3 and 1.0, and the junction temperature ratio is a ratio of a temperature of the first amplifier to a temperature of the second amplifier.

14. The method of claim 13, further comprising:

biasing the first amplifier as a class A amplifier, a class B amplifier, or a class AB amplifier; and biasing the second amplifier as a class C amplifier.

15. The method of claim 13, wherein the first device periphery, the first supply voltage, the second device periphery, and the second supply voltage are configured such that the first amplifier and the second amplifier deliver a same peak power.

16. The method of claim 13, wherein the first device periphery, the first supply voltage, the second device periphery, and the second supply voltage are configured to maintain the junction temperature ratio of between 0.3 and 1.0 for a given power ratio between the second transistor and the first transistor.

17. The method of claim 13, wherein the RF input signal has a peak-to-average ratio of at least 10 dB.

18. The method of claim 13, further comprising coupling the RF input signal to the inputs of the first amplifier and the second amplifier via an input network.

19. The method of claim 13, wherein the first amplifier comprises a plurality of first amplifiers.

20. The method of claim 13, wherein the first amplifier, the second amplifier, and the combining network form a Doherty amplifier.

21. The method of claim 13, wherein:

the first transistor comprises a first gallium nitride (GaN) transistor; and the second transistor comprises a second GaN transistor.

22. An amplifier comprising:

a first gallium nitride (GaN) transistor coupled to a first supply node configured to receive a first supply voltage and having a first device periphery;

a second GaN transistor coupled to a second supply node configured to receive a second supply voltage higher than the first supply voltage and having a second device periphery smaller than the first device periphery, wherein the second GaN transistor is biased as a class C amplifier;

an input network coupled to an input port, a control node of the first GaN transistor, and a control node of the second GaN transistor; and a combining network coupled to an output port, an output node of the first GaN transistor, and an output node of the second GaN transistor, wherein the first device periphery, the first supply voltage, the second device periphery, and the second supply voltage are configured to maintain a junction temperature ratio of between 0.3 and 1.0 for an RF input signal having a given peak-to-average ratio, and the junction temperature ratio is a ratio of a temperature of the first GaN transistor to a temperature of the second GaN transistor.

* * * * *